(12) United States Patent
Abatchev et al.

(10) Patent No.: US 7,857,982 B2
(45) Date of Patent: Dec. 28, 2010

(54) METHODS OF ETCHING FEATURES INTO SUBSTRATES

(75) Inventors: Mirzafer Abatchev, Boise, ID (US);
Gurtej S. Sandhu, Boise, ID (US);
Aaron R. Wilson, Boise, ID (US); Tony Schrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1561 days.

(21) Appl. No.: 11/185,229

(22) Filed: Jul. 19, 2005

(65) Prior Publication Data

US 2007/0020936 A1    Jan. 25, 2007

(51) Int. Cl.
*H01L 21/302* (2006.01)

(52) U.S. Cl. .............................. 216/13; 216/17; 216/41; 216/47; 216/67; 216/72; 216/79; 438/696; 438/700; 438/717; 438/719; 438/736; 438/738; 438/906; 438/945

(58) Field of Classification Search ................. 438/700, 438/706, 712, 717, 723, 724, 725; 216/67, 216/74, 47
See application file for complete search history.

(56) References Cited

U.S. PATENT DOCUMENTS

| | | | | |
|---|---|---|---|---|
| 4,702,795 A * | 10/1987 | Douglas | ...................... | 438/695 |
| 4,855,017 A * | 8/1989 | Douglas | ...................... | 438/695 |
| 5,041,362 A | 8/1991 | Douglas | | |
| 5,738,757 A * | 4/1998 | Burns et al. | .................. | 438/603 |
| 6,027,967 A | 2/2000 | Parekh et al. | | |
| 6,087,270 A | 7/2000 | Reinberg et al. | | |
| 6,136,511 A | 10/2000 | Reinberg et al. | | |
| 6,232,235 B1 | 5/2001 | Cave et al. | | |
| 6,303,434 B1 | 10/2001 | Parekh et al. | | |
| 6,331,720 B1 | 12/2001 | Parekh et al. | | |
| 6,333,256 B2 | 12/2001 | Sandhu et al. | | |
| 6,448,176 B1 * | 9/2002 | Grill et al. | ................... | 438/637 |
| 6,479,391 B2 * | 11/2002 | Morrow et al. | .............. | 438/706 |
| 6,682,873 B2 | 1/2004 | Michiels et al. | | |
| 6,852,640 B2 | 2/2005 | Gutsche | | |
| 6,919,259 B2 * | 7/2005 | Chang et al. | ................. | 438/421 |
| 7,105,361 B2 * | 9/2006 | Chen et al. | ...................... | 438/3 |
| 7,585,780 B2 * | 9/2009 | Kim | ........................... | 438/725 |
| 7,589,024 B2 * | 9/2009 | Ueda | .......................... | 438/696 |
| 2003/0129844 A1 * | 7/2003 | Wang et al. | ................. | 438/694 |
| 2004/0048477 A1 * | 3/2004 | Saito et al. | ................... | 438/689 |
| 2004/0198065 A1 * | 10/2004 | Lee et al. | .................... | 438/725 |
| 2004/0214113 A1 | 10/2004 | Goldstein et al. | | |

(Continued)

*Primary Examiner*—Anita K Alanko
(74) *Attorney, Agent, or Firm*—Wells St. John P.S.

(57) ABSTRACT

The invention includes methods of etching features into substrates. A plurality of hard mask layers is formed over material of a substrate to be etched. A feature pattern is formed in such layers. A feature is etched only partially into the substrate material using the hard mask layers with the feature pattern therein as a mask. After the partial etching, at least one of the hard mask layers is etched selectively relative to the substrate material and remaining of the hard mask layers. After etching at least one of the hard mask layers, the feature is further etched into the substrate material using at least an innermost of the hard mask layers as a mask. After the further etching, the innermost hard mask layer and any hard mask layers remaining thereover are removed from the substrate, and at least a portion of the feature is incorporated into an integrated circuit.

20 Claims, 13 Drawing Sheets

U.S. PATENT DOCUMENTS

| | | |
|---|---|---|
| 2004/0256647 A1 | 12/2004 | Lee et al. |
| 2004/0266201 A1 | 12/2004 | Wille et al. |
| 2005/0042871 A1* | 2/2005 | Tzou et al. .................. 438/689 |
| 2005/0079701 A1 | 4/2005 | Baks et al. |
| 2005/0167839 A1* | 8/2005 | Wetzel et al. ............... 257/758 |
| 2005/0170625 A1* | 8/2005 | Cong et al. .................. 438/597 |
| 2005/0196952 A1* | 9/2005 | Genz et al. .................. 438/622 |
| 2006/0024945 A1* | 2/2006 | Kim et al. .................... 438/618 |
| 2006/0024965 A1* | 2/2006 | Yang .......................... 438/689 |
| 2006/0127680 A1* | 6/2006 | Tzou et al. .................. 428/427 |
| 2007/0125750 A1* | 6/2007 | Weng et al. .................. 216/67 |

* cited by examiner

METHODS OF ETCHING FEATURES INTO SUBSTRATES

TECHNICAL FIELD

This invention relates to methods of etching features into substrates.

BACKGROUND OF THE INVENTION

Integrated circuitry fabrication typically encompasses the patterning of various features relative to substrate material. Examples include trenches, contact openings and subtractive patterning of layers for the formation of circuit devices, such as transistor gates, capacitors, diodes, etc. over underlying material. One common method of patterning features formed by etching includes photolithography. Such typically includes the deposition of a patternable masking layer, commonly known as photoresist. Such materials can be processed to modify their solubility in certain solvents, and thereby are readily usable to form patterns on a substrate. For example, portions of a deposited photoresist layer can be exposed to actinic energy through openings in a mask or reticle to change the solvent solubility of the exposed regions versus the unexposed regions compared to the solubility in the as-deposited state. Thereafter, the exposed or unexposed regions can be removed depending upon the type of photoresist, thereby leaving a masking pattern of the photoresist on the substrate. Adjacent areas of the underlying substrate next to the masked portions can be processed, for example by etching, to form a desired feature in the substrate adjacent the masking material. In certain instances, multiple different layers of photoresists and/or a combination of photoresists with non-radiation sensitivity masking materials are utilized.

Exemplary prior art problems which motivated aspects of the invention are described in connection with FIGS. 1 and 2. Referring initially to FIG. 1, a substrate fragment is indicated generally with reference numeral 10. Such comprises a substrate material 12 to be patterned having a masking layer 14 formed thereover. Substrate 12 typically comprises a semiconductor substrate, and might comprise various insulating, semiconducting and conducting layers formed over a bulk semiconductive material, for example monocrystalline silicon. Alternately by way of example only, substrate 12 might comprise a semiconductor-on-insulator substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In this particular example, the particular exemplary feature formed within substrate material 12 comprises an opening 16. An opening 18 has been patterned within masking material 14 for the formation of opening 16 in substrate material 12. A desired intent is that the outline of opening 18 formed within masking material 14 be identically duplicated in the etch of material 12 in forming feature 16. However in some instances, opening 18 in material 14 can develop ramped or sloped outer-angling sidewalls 20. High energy etching ions 13 can collide with such surfaces causing displacement of material of masking layer 14 and redeposition on the opposing sidewall, thereby resulting in the exemplary depicted residue 22. Such can result in considerably sloped sidewalls of feature 16 within substrate material 12, and a corresponding decrease in the size of the opening being etched at the bottom of such openings.

FIG. 2 illustrates another typically undesired artifact with respect to a substrate fragment 10a. Like numerals from the FIG. 1 embodiment are utilized where appropriate, with differences being indicated with the suffix "a" or with different numerals. In FIG. 2, high energy ions 13 are depicted as deflecting from sloped surfaces 20 without necessarily displacing the material of masking layer 14, but otherwise hitting opposite sidewalls within material 12. Such can result in the bowed profile regions 24 which also adversely affect the profile of the opening 16a being formed in material 12.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention includes methods of etching features into substrates. In one implementation, a plurality of hard mask layers is formed over material of a substrate to be etched. A feature pattern is formed in the plurality of hard mask layers. A feature is etched only partially into the substrate material using the plurality of hard mask layers with the feature pattern therein as a mask. After the partial etching, at least one of the hard mask layers is etched selectively relative to the substrate material and remaining of the hard mask layers. After etching at least one of the hard mask layers, the feature is further etched into the substrate material using at least an innermost of the hard mask layers as a mask. After the further etching, the innermost hard mask layer and any hard mask layers remaining thereover are removed from the substrate, and at least a portion of the feature is incorporated into an integrated circuit.

In one implementation, a method of forming a feature in a substrate includes forming sacrificial masking material over material of a substrate to be etched. The sacrificial masking material comprises at least four masking layers received over the substrate material. An outermost of the at least four masking layers comprises an imaging layer. With the imaging layer, at least the one of the at least four masking layers immediately adjacent the imaging layer is patterned. After patterning such immediately adjacent layer, remaining of the at least four masking layers are patterned using at least one overlying one of the at least four masking layers as a mask. Using only some of the at least four masking layers as a mask, a feature is etched only partially into the substrate material. After such partial etching, only some of the sacrificial masking material is etched selectively relative to the substrate material. After etching only some of the sacrificial masking material, further etching of the feature into the substrate material is conducted using at least an innermost of the at least four masking layers as a mask. After such further etching, all remaining of said formed sacrificial masking material is removed from the substrate, and at least a portion of the feature is incorporated into an integrated circuit.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 3:
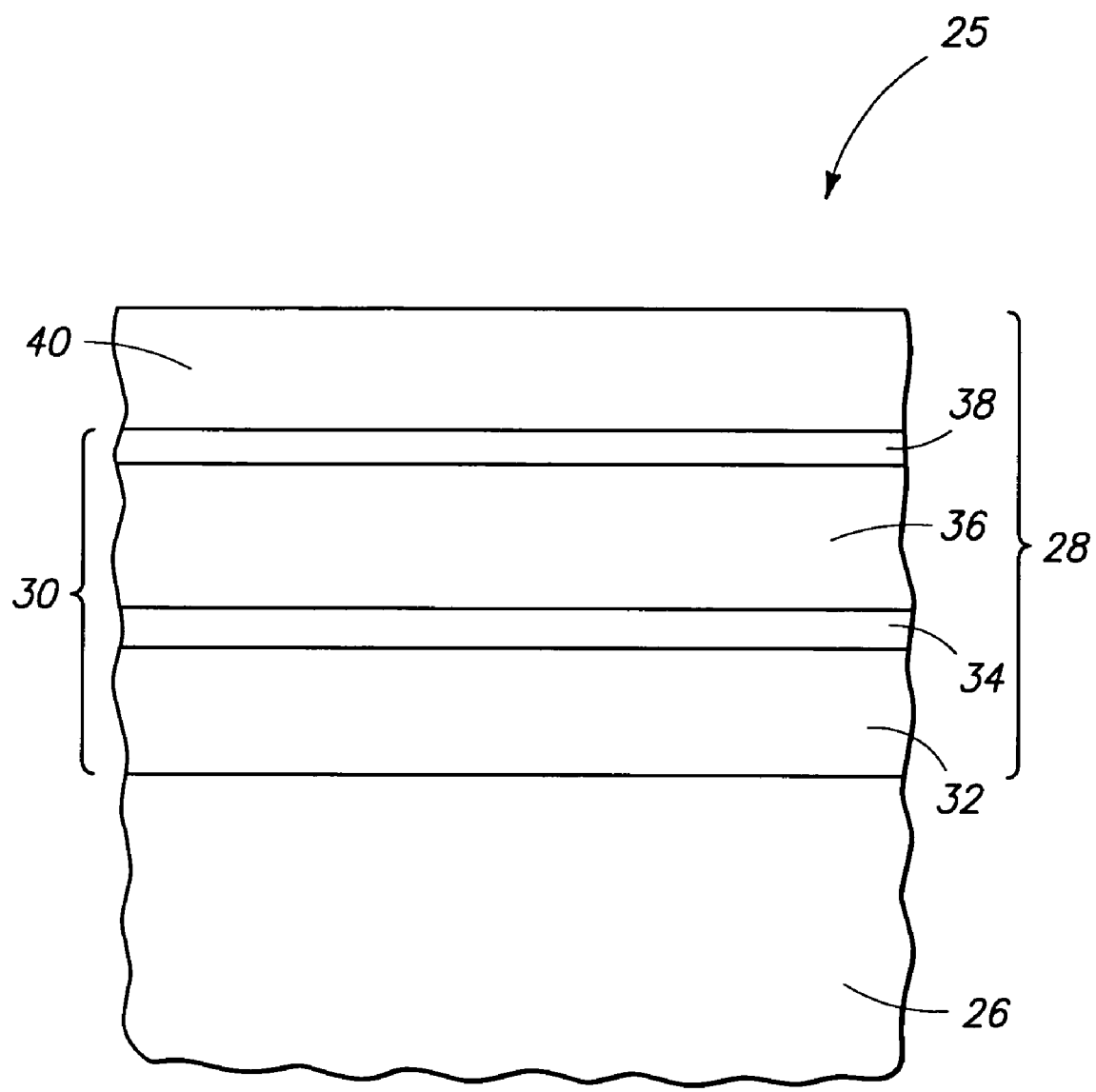
FIG. 3 is a diagrammatic sectional view of a substrate fragment in process in accordance with an aspect of the invention.

Exemplary preferred methods of forming a feature by etching into a substrate are described initially with reference to FIGS. 3-13. FIG. 3 depicts a substrate fragment 25 comprising some material 26 to be etched. Substrate 25 might comprise a semiconductor substrate, and material 26 to be etched might be comprised of one or more different composition materials and/or layers. By way of example only, material 26 might comprise monocrystalline silicon within which a feature, such as a trench or other opening, is to be formed. Alternately by way of example only, material 26 might comprise a semiconductor-on-insulator substrate. Regardless and further by way of example only, material 26 might comprise one or more materials of which a capacitor or transistor gate is to be fabricated over underlying material or layers.

In one implementation, sacrificial masking material 28 has been formed over material 26 which is to be etched. In one implementation, sacrificial masking material 28 comprises at least four masking layers, with an outermost layer thereof comprising an imaging layer. In the context of this document, an imaging layer is any layer comprising an active compound that undergoes a chemical reaction in response to exposure to actinic energy, or the like, such that the material is capable of patterning using solvent or other processing subsequent to actinic energy exposure.

In one preferred embodiment, masking material 28 comprises a plurality of hard mask layers 30 received over substrate material 26 which will be etched. In the depicted preferred embodiment, sacrificial masking material 28 comprises a first masking layer 32 received over substrate material 26. Exemplary preferred materials include at least one of amorphous silicon, polysilicon, and amorphous carbon. In the context of this document, "amorphous" refers to a material having no greater than 10% crystalline phase material. An exemplary preferred thickness range for first masking layer 32 is from 1,000 Angstroms to 10,000 Angstroms. Reference to "first" in the characterization of masking layer 32 does not necessarily require that such be the initial masking layer formed over substrate material 26, and accordingly one or more masking layers might be provided below a "first" masking layer. Likewise, subsequent reference to "second", "third", etc., is for comparative representation relative to the others in a numbered sequence, and does not preclude intervening layers. Yet in the depicted and but one exemplary preferred embodiment, masking layer 32 is an innermost masking layer received over material 26 to be etched.

A second masking layer 34 is received over first masking layer 32. Exemplary preferred materials include at least one of amorphous silicon and/or silicon nitride. An exemplary preferred thickness range for masking layer 34 is from 200 Angstroms to 500 Angstroms.

A third masking layer 36 is received over second masking layer 34. Exemplary preferred materials include at least one of amorphous silicon, polysilicon, and amorphous carbon. Regardless, first masking layer 32 and third masking layer 36 might be of the same composition, or of different compositions. A preferred thickness range for masking layer 36 is from 1,000 Angstroms to 10,000 Angstroms. First masking layer 32 and third masking layer 36 might be of the same thickness, or be of different thicknesses. Further, second masking layer 34 is preferably and typically thinner than either of the thicknesses of first and third masking layers 32 and 36, respectively, although any other relative thicknesses are also contemplated.

In one implementation, substrate material 26 is selectively etchable relative to at least first masking layer 32. In the context of this document, a material which is selectively etchable relative to another material, or a selective act of etching, requires a removal rate of at least 2:1 of the selectively etchable material relative to the another material. In one implementation, third masking layer 36 is at least selectively etchable relative to second masking layer 34. In one implementation, second masking layer 34 is at least selectively etchable relative to first masking layer 32 and to third masking layer 36 (and in one implementation relative to a fourth masking layer 38 referred to below). In one implementation, first masking layer 32 is at least selectively etchable relative to substrate material 26.

Still referring to FIG. 3, a fourth masking layer 38, preferably comprising an antireflective coating or silicon-containing organic film, is formed over third masking layer 36. Exemplary antireflective coating materials include silicon oxynitrides, such as $SiO_xN_y$, and which also effectively functions as a hard mask having greater etch resistance than photoresist in etch of typical underlying material(s). An exemplary preferred thickness range for layer 38 is from 200 Angstroms to 600 Angstroms.

An imaging layer 40 is formed over layer 38. One exemplary preferred composition imaging layer is photoresist, including organic and inorganic photoresists. An exemplary preferred thickness range for imaging layer 40 is from 500 Angstroms to 3,000 Angstroms.

Figure 4:
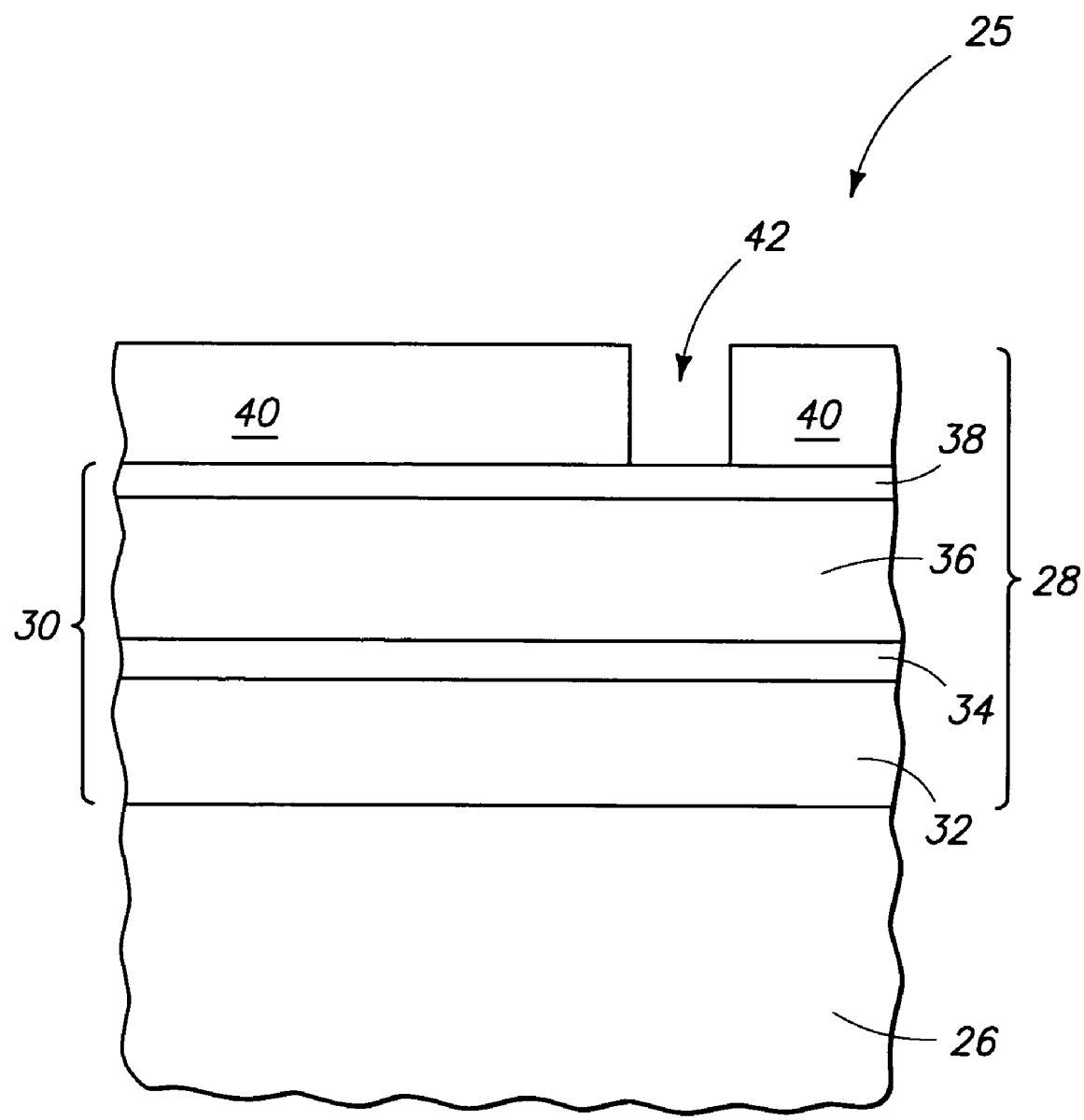
FIG. 4 is a view the FIG. 3 substrate fragment at a processing step subsequent to that shown by FIG. 3.

Referring to FIG. 4, a feature pattern 42 has been formed in imaging layer 40. In the illustrated example, feature pattern 42 for simplicity is indicated as comprising a single opening within imaging layer 40. By way of example only, such might be utilized for forming a trench, hole, or other opening in material 26, as will be described subsequently with respect to but one exemplary embodiment. Alternately by way of example only, the feature pattern might comprise a plurality of such openings, or a structure within imaging layer 40 from which an ultimately elevated structure might be formed from material 26, for example in the patterning of a gate or other interconnect line.

Figure 5:
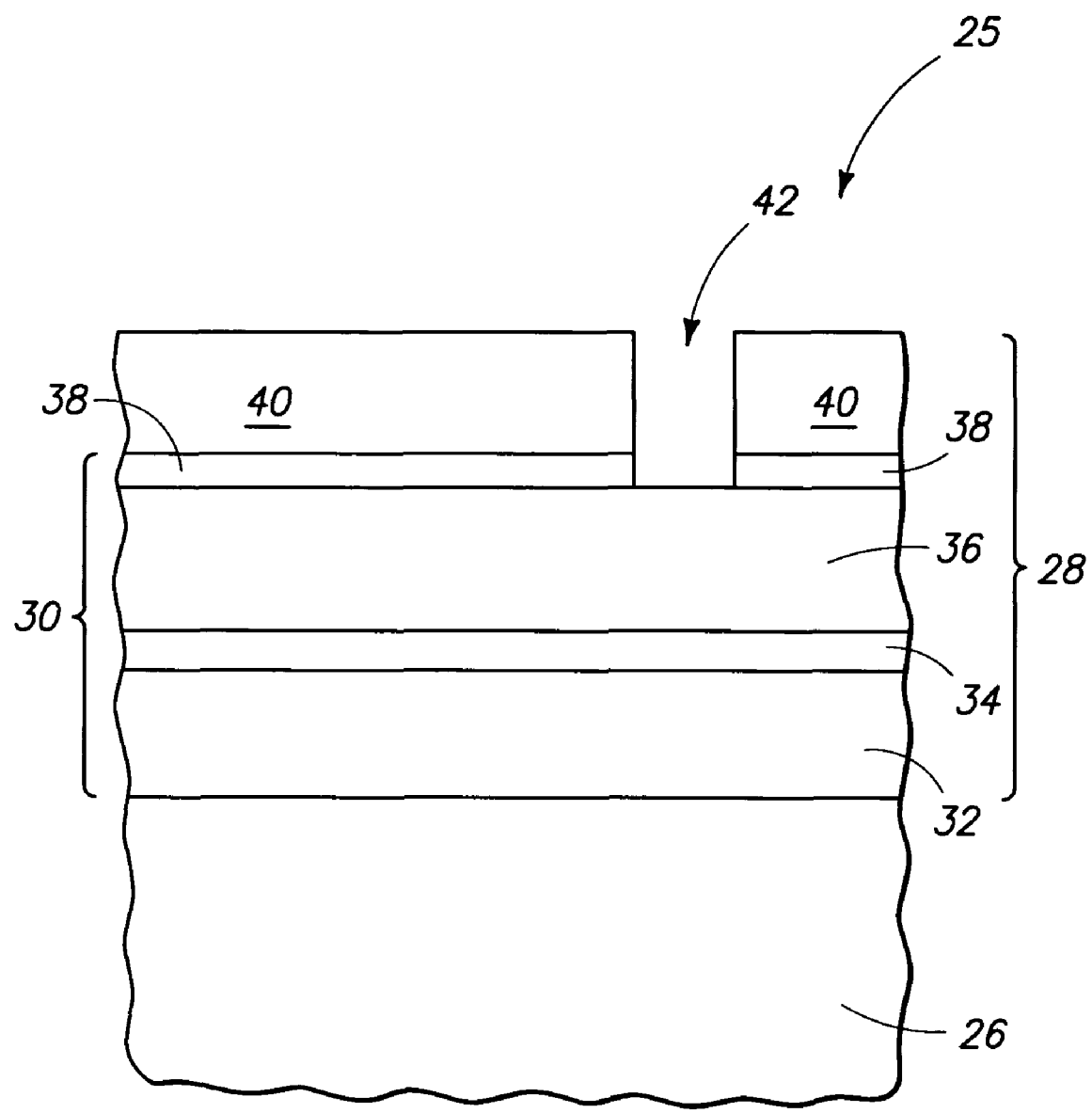
FIG. 5 is a view the FIG. 4 substrate fragment at a processing step subsequent to that shown by FIG. 4.

Referring to FIG. 5 and using imaging layer 40, at least masking layer 38 immediately adjacent imaging layer 40 is patterned using imaging layer 40 as a mask. Where masking layer 38 comprises a silicon oxynitride antireflective coating, exemplary anisotropic etching chemistries include one or a combination of $CF_4$ and $CHF_3$ with or without inert gasses. Accordingly in such example, feature pattern 42 has been at least largely transferred to fourth masking layer 38. Preferred anisotropic etching conditions used here and elsewhere comprise plasma etching.

Figure 6:
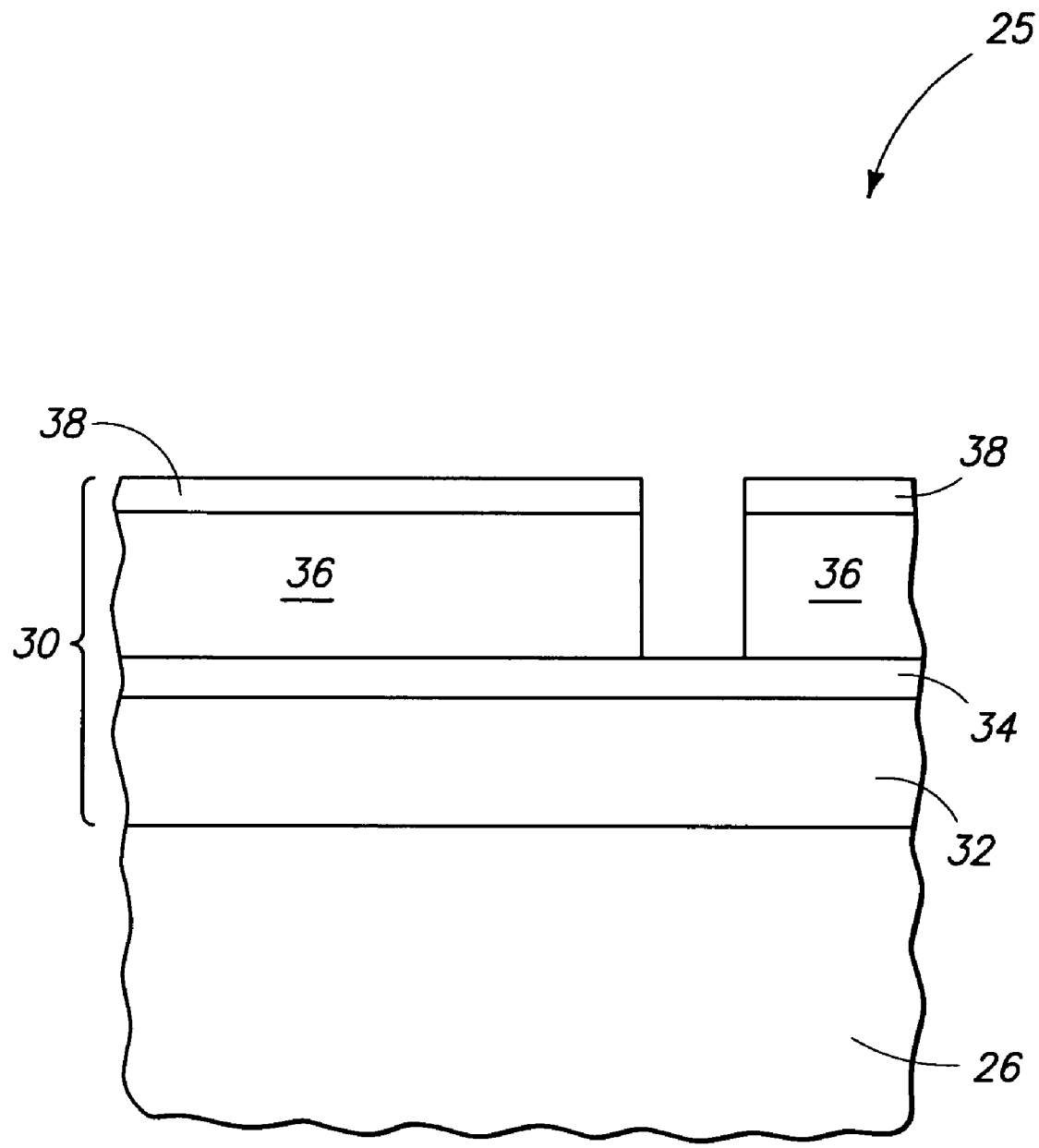
FIG. 6 is a view the FIG. 5 substrate fragment at a processing step subsequent to that shown by FIG. 5.

Referring to FIG. 6, third masking layer 36 has been patterned by etching such layer to second masking layer 34, and selectively relative to second masking layer 34, using the feature pattern of the imaging layer which was transferred previously to fourth masking layer 38. An exemplary preferred anisotropic etching chemistry where third masking layer 36 comprises amorphous carbon is utilizing one or both of $SO_2$ and $O_2$. Where imaging layer 40 (not shown) comprises an organic photoresist, such chemistry will also typically remove imaging layer 40, as shown.

Figure 7:
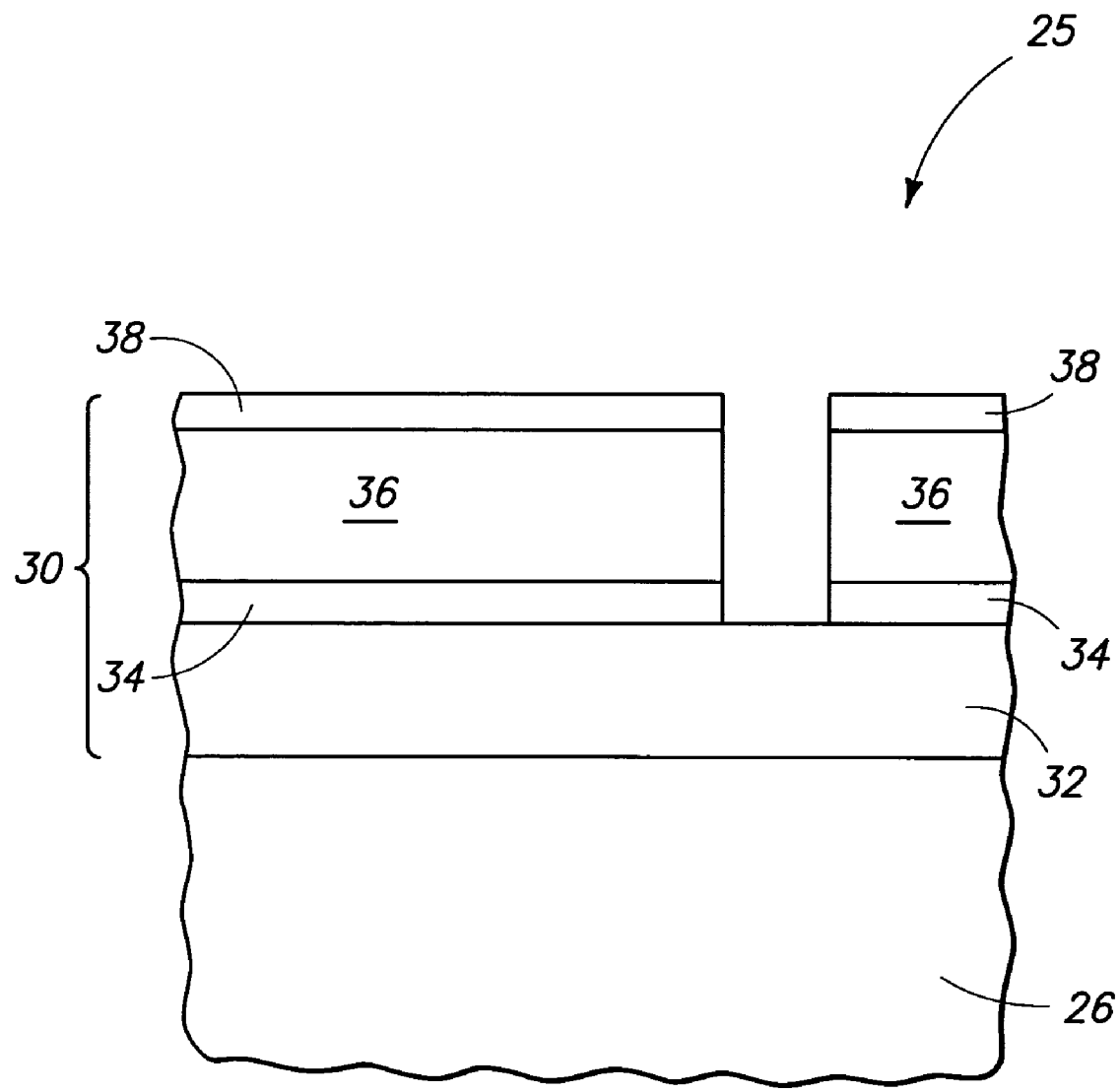
FIG. 7 is a view the FIG. 6 substrate fragment at a processing step subsequent to that shown by FIG. 6.

Referring to FIG. 7, second masking layer 34 has been patterned by etching the second masking layer to first masking layer 32, and selectively relative to first masking layer 32, using patterned third masking layer 36 as a mask. (Fourth masking layer 38 is also used as a mask, but at least patterned third masking layer 36 is used as a mask due to its proximity to second masking layer 34 in the depicted preferred embodiment). An exemplary anisotropic etching chemistry includes a HBr and $Cl_2$ plasma etch.

Figure 8:
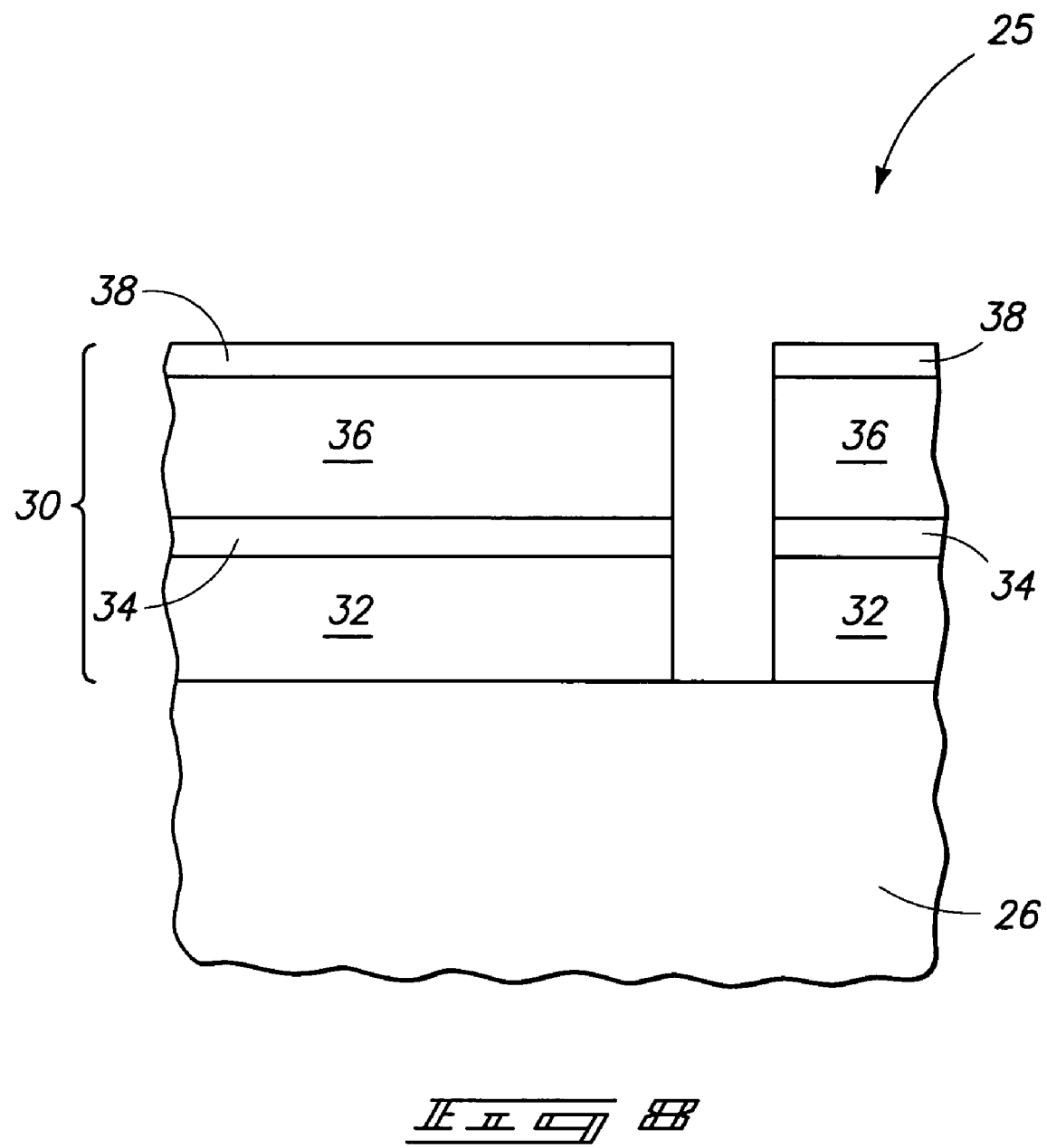
FIG. 8 is a view the FIG. 7 substrate fragment at a processing step subsequent to that shown by FIG. 7.

Referring to FIG. 8, first masking layer 32 is patterned by etching such first masking layer to substrate material 26 using second masking layer 34, third masking layer 36, and fourth masking layer 38 as a mask. An exemplary preferred etching chemistry is the $SO_2/O_2$ chemistry referred to above. At least where an outermost portion of substrate material 26 comprises silicon or silicon dioxide, such etching chemistry is substantially selective relative to substrate material 26.

The above described processing is but one preferred implementation of forming a feature pattern in a plurality of hard mask layers 30. Further in one exemplary preferred embodiment, four masking layers 32, 34, 36 and 38 have been patterned using at least one overlying one of the at least four masking layers as a mask. In certain implementations, more layers might be utilized, with the masking layers of material 28 (FIG. 3) in the described embodiment numbering at least five.

Figure 1:
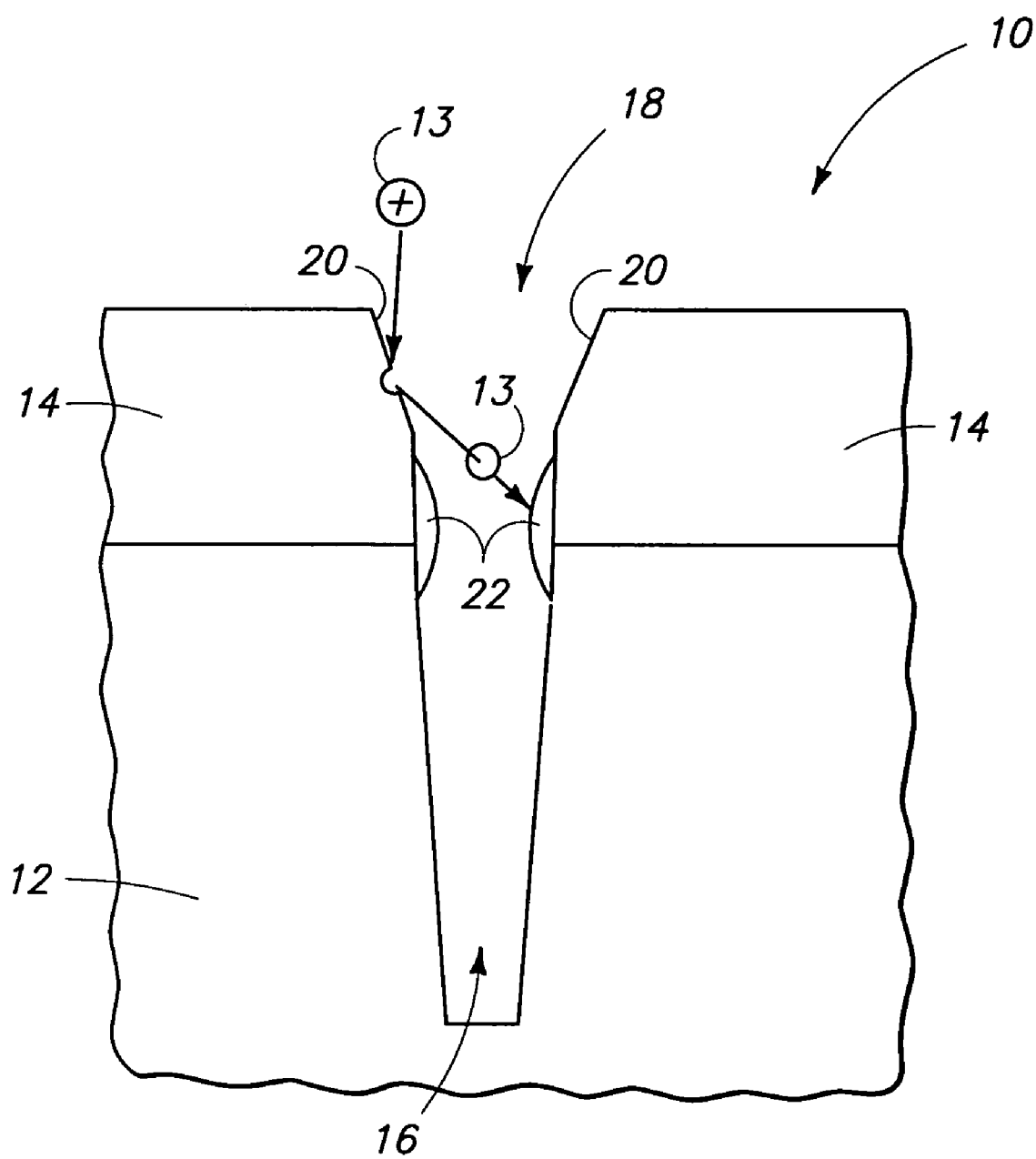
FIG. 1 is a diagrammatic sectional view of a prior art substrate fragment illustrating a problem which motivated the invention.
Figure 2:
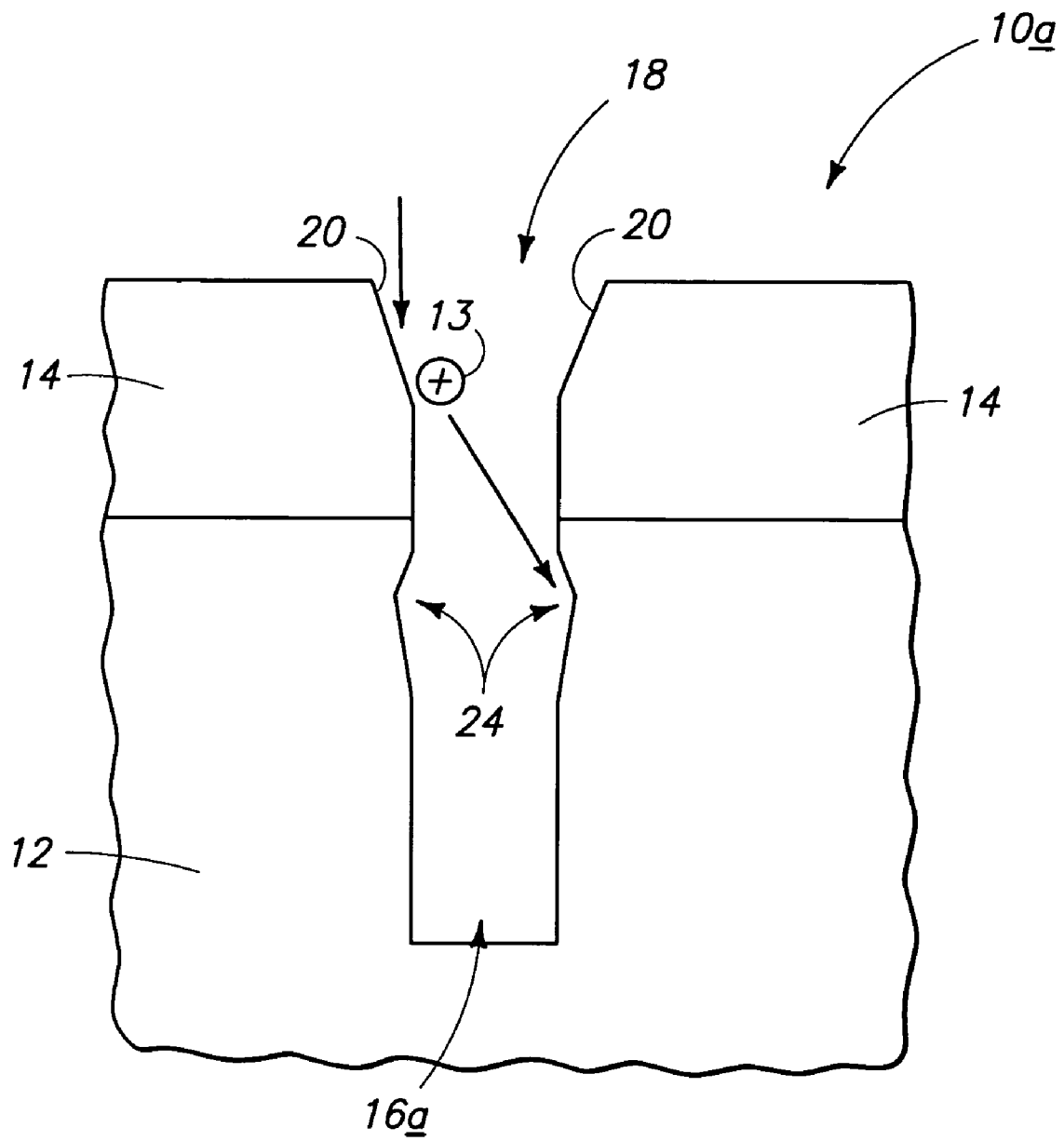
FIG. 2 is a diagrammatic sectional view of another prior art substrate fragment illustrating another problem which motivated the invention.
Figure 9:
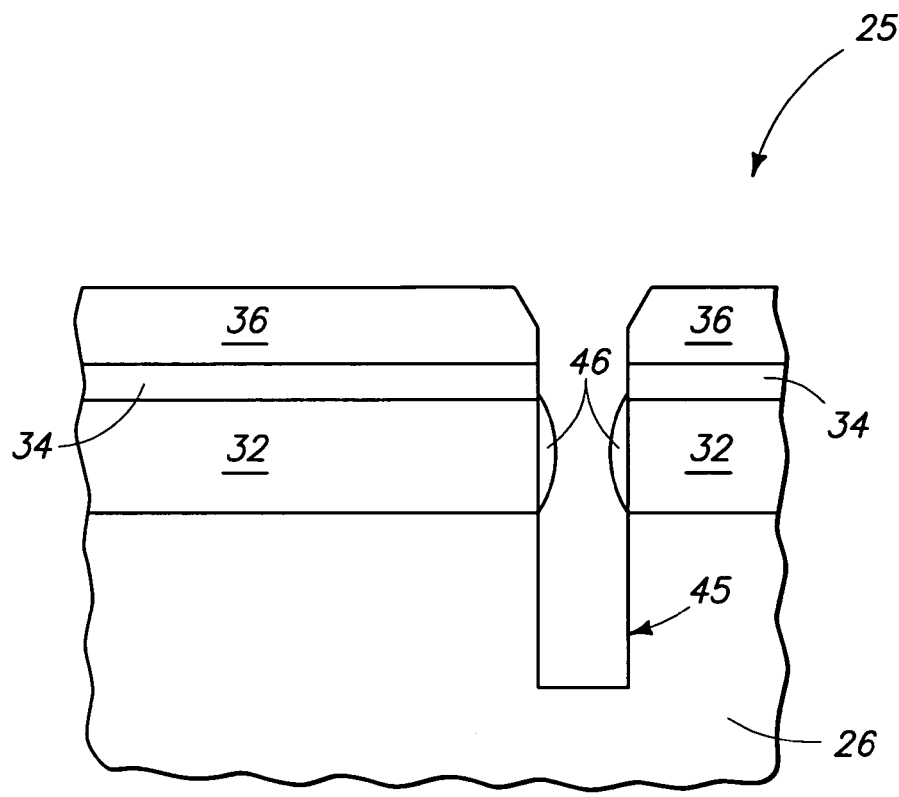
FIG. 9 is a view the FIG. 8 substrate fragment at a processing step subsequent to that shown by FIG. 8.

Referring to FIG. 9, a feature 45 has been etched only partially into substrate material 26 using the plurality of hard mask layers 32, 34, 36 and 38 as a mask. In the depicted exemplary embodiment, masking layer 40 (not shown) has not been utilized as it was previously etched from the substrate. Also, where for example material 26 being etched is silicon or silicon dioxide, and masking layer 38 (not shown) comprises silicon oxynitride, an exemplary etching chemistry of $HBr/Cl_2$ for silicon or a fluorocarbon-containing plasma for silicon dioxide will also etch masking layer 38 from the substrate during the etch, as shown. Further, some of third masking layer 36 may or may not also be removed. In one preferred embodiment, the depicted partial etching of feature 45 is from 30% to 80% of the total ultimate desired depth of the etching of feature 45 within material 26, and even more preferably from 40% to 60%. In the depicted exemplary embodiment, the partial etching is depicted as forming a first residue 46 within the feature pattern over at least first masking layer 32. Such residue might result from the redeposit of etched portions of the outer layers of the masking materials, and by way of example only in conjunction with the prior art problem that motivated the invention as described above in connection with FIG. 1. Alternately, very little or no residue might form.

Figure 10:
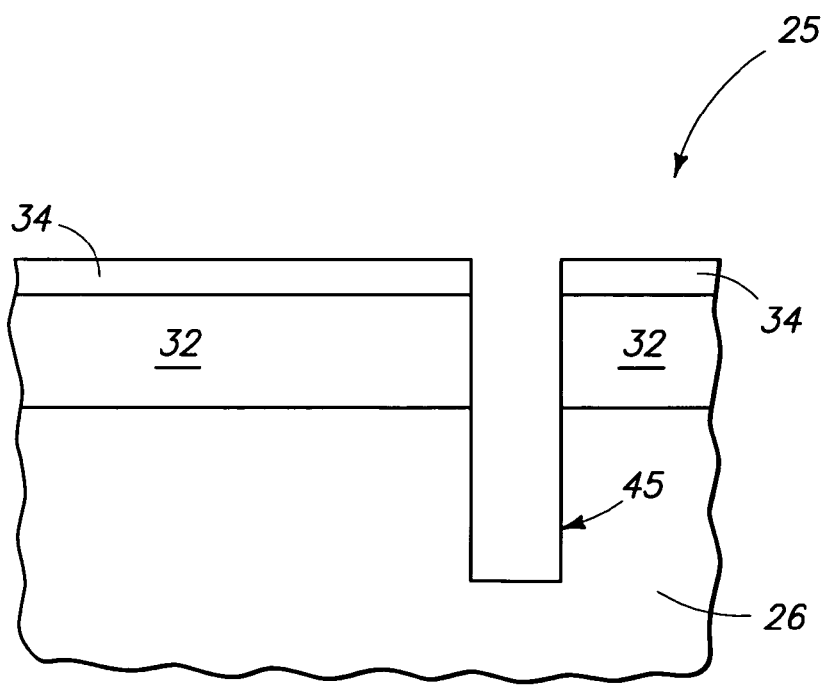
FIG. 10 is a view the FIG. 9 substrate fragment at a processing step subsequent to that shown by FIG. 9.

After the partial etching, at least one of the hard mask layers is etched selectively relative to substrate material 26 and remaining of the hard mask layers. For example, FIG. 10 depicts the etching of third masking layer 36 (not shown) selectively relative to substrate material 26 and second masking layer 34. Where third masking material 36 comprises amorphous carbon, an exemplary preferred chemistry is one or a combination of an $SO_2$ and $O_2$ plasma. In one preferred implementation and as shown, the etching of the third masking layer also has etched first residue 46 (not shown in FIG. 10) from the substrate. Further and alternately, some of material 26 might be etched in the etch of third masking layer 36.

Figure 11:
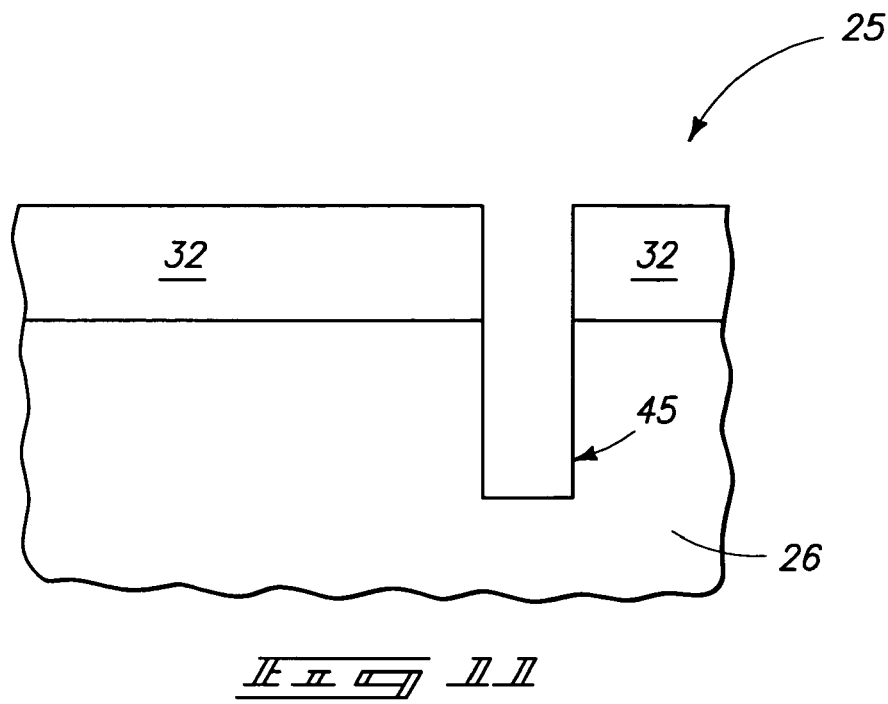
FIG. 11 is a view the FIG. 10 substrate fragment at a processing step subsequent to that shown by FIG. 10.

Referring to FIG. 11, second masking layer 34 (not shown) has been etched substantially selectively relative to first masking layer 32 and substrate material 26. An exemplary etching chemistry, where second masking layer 34 comprises amorphous silicon and substrate material 26 comprises monocrystalline silicon, is $HBr/Cl_2$ for silicon, or a fluorocarbon-containing plasma for silicon dioxide. Of course, some of substrate material 26 might be etched while etching second masking layer 34.

Figure 12:
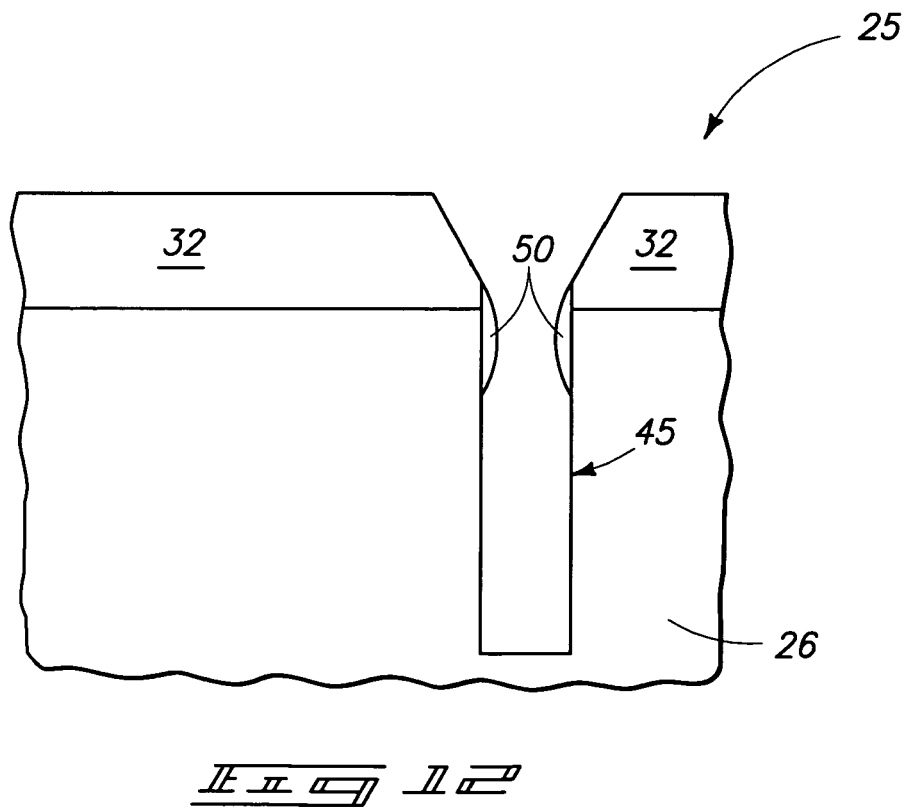
FIG. 12 is a view the FIG. 11 substrate fragment at a processing step subsequent to that shown by FIG. 11.

Referring to FIG. 12, feature 45 has been further etched into substrate material 26 using at least innermost hard masking layer 32 as a mask. An exemplary etching chemistry includes $HBr/Cl_2$ for silicon or a fluorocarbon-containing plasma for silicon dioxide. Accordingly for example in certain instances, second masking layer 34 (not shown) might not be substantially selectively etched relative to first masking layer 32 in a dedicated step as referred to above in connection with FIG. 11, with such being removed during the further etching of substrate material 26. Regardless, in the depicted embodiment, such further etching has formed a second residue 50 over at least innermost hard mask layer 32, and further in the depicted exemplary embodiment also laterally over substrate material 26.

Figure 13:
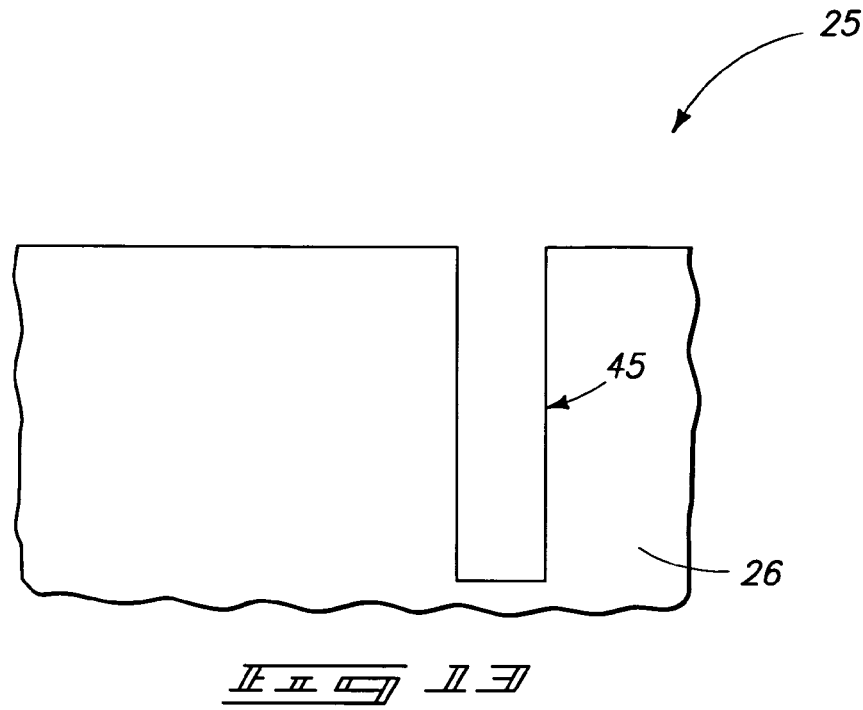
FIG. 13 is a view the FIG. 12 substrate fragment at a processing step subsequent to that shown by FIG. 12.

Referring to FIG. 13 and after such further etching, innermost hard mask layer 32 (not shown) and any portion of the hard mask layers remaining thereover have been removed from the substrate. Such preferably occurs by etching, and which also preferably etches away second residue 50 (not shown) during the etching of innermost hard mask 32. In one exemplary implementation, feature 45 within substrate material 26 after such further etching has an aspect ratio of at least 4.0. Regardless, at least a portion of feature 45 is ultimately incorporated into an integrated circuit.

Figure 14:
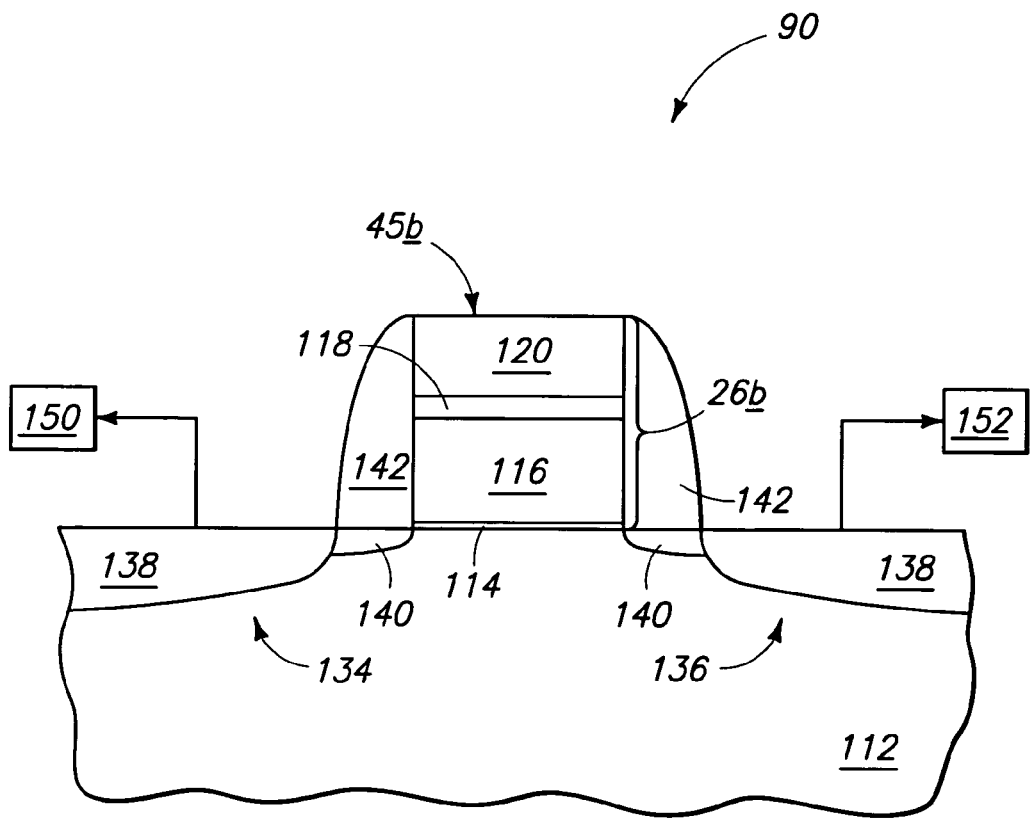
FIG. 14 is a view of an alternate embodiment substrate processing in accordance with aspects of the invention.

For example, the feature might encompass a trench within which transistors, such as vertical or other transistors, or other devices might be formed. The integrated circuit formed might comprise any circuit, or sub-circuit. Further by way of example only, such might comprise memory circuitry, for example DRAM circuitry. For example, FIG. 14 depicts an alternate embodiment feature 45b in the form of a transistor gate fabricated from material 26b, and incorporated into a field effect transistor 90. Like numerals from the first described embodiment have been used where appropriate, with differences being indicated with the suffix "b", and with different numerals. Material 26b and feature 45b are depicted as comprising a gate dielectric 114, a conductively doped polysilicon layer 116, a more conductive refractory metal and/or refractory metal silicide layer 118, and an insulative cap 120.

Source/drain regions 134 and 136 have been formed within a substrate 112. Such exemplary source/drain regions are depicted as comprising a deep, heavily-doped portion, 138 and a shallow, lightly-doped, portion 140. Source/drain regions 134 and 136 can be formed utilizing conventional methods or yet-to-be developed methods, and the conductivity-enhancing dopant within regions 138 and 140 can comprise either p-type dopant or n-type dopant, by way of example. Electrically insulative sidewall spacers 142 have been formed along the sidewalls of feature 45b. Exemplary preferred materials include one or both of silicon nitride and silicon dioxide.

In the depicted exemplary construction, feature 45b is incorporated into a DRAM cell. Specifically, source/drain region 134 is electrically connected to a storage device 150, and the other source/drain region 136 is electrically connected to a bitline 152. Storage device 150 can comprise any suitable device, including a capacitor, for example. Bitline 152 can comprise any suitable construction. Feature 45b can be considered to be part of an integrated circuit, for example the DRAM integrated circuitry just described.

Figure 15:
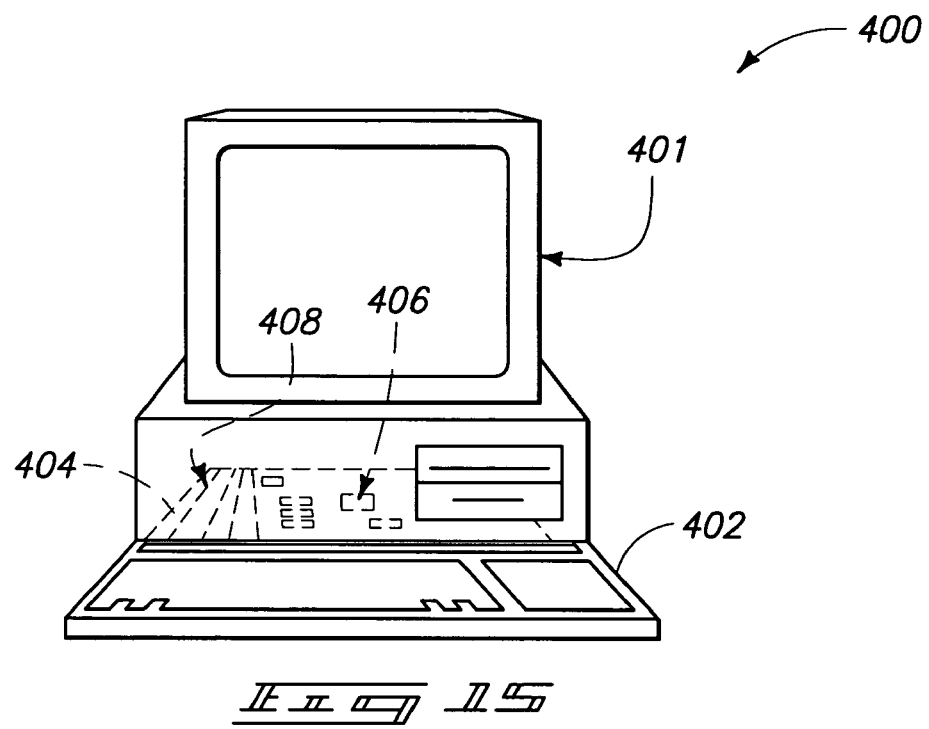
FIG. 15 is a diagrammatic view of a computer illustrating an exemplary application of the present invention.
Figure 16:
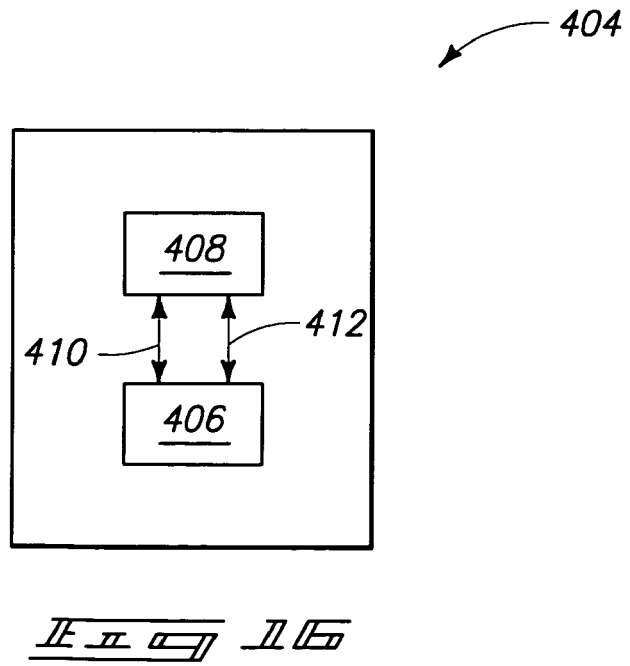
FIG. 16 is a block diagram showing particular features of the motherboard of the FIG. 15 computer.

FIG. 15 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above, including, for example, one or more of the wordlines, bitlines and DRAM unit cells. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 16. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation which utilizes the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices, by way of example only, include SDRAM, DDR SDRAM, SLDRAM, VRAM and Direct RDRAM, as well as others such as SRAM or Flash memories.

Figure 17:
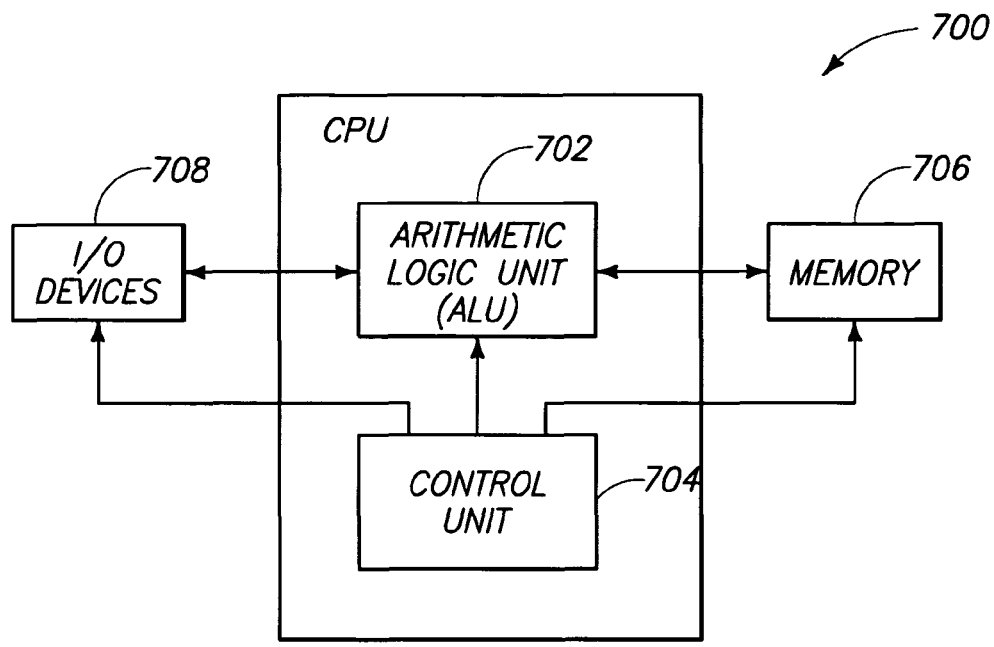
FIG. 17 is a high-level block diagram of an electronic system according to an exemplary aspect of the present invention.

FIG. 17 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by processor 702 and other interactions between processor 702, memory device unit 706 and I/O devices 708. Control unit 704 coordinates all operations of processor 702, memory device 706 and I/O devices 708 by continuously cycling through a set of operations that cause instructions to be fetched from memory device 706 and executed. In various embodiments, memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells, wordlines and bitlines in accordance with various aspects of the present invention.

Figure 18:
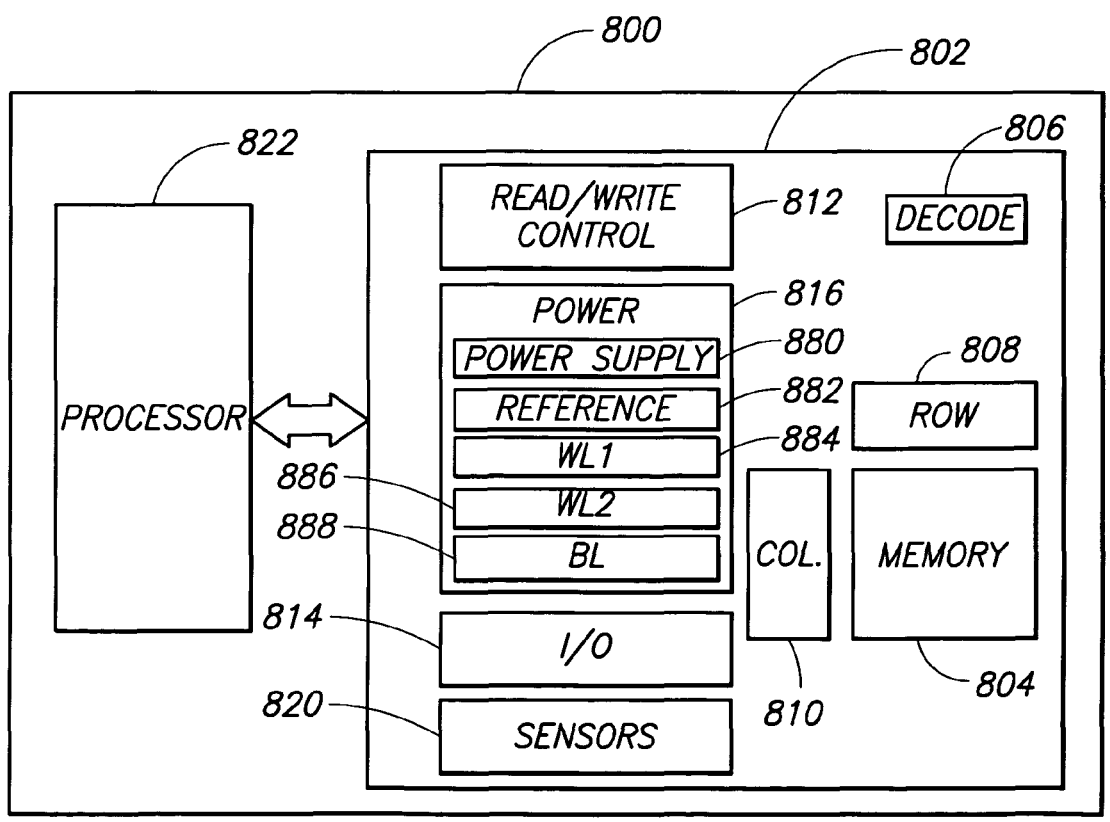
FIG. 18 is a simplified block diagram of an exemplary electronic system according to an aspect of the present invention.

FIG. 18 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. Memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. System 800 also includes a processor 822, or memory controller for memory accessing.

Memory device 802 receives control signals 824 from processor 822 over wiring or metallization lines. Memory device 802 is used to store data which is accessed via I/O lines. It will be appreciated by those skilled in the art that additional circuitry and control signals can be provided, and that memory device 802 has been simplified to help focus on the invention. At least one of processor 822 or memory device 802 can include a DRAM cell of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of ordinary skill in the art will understand that the various electronic systems can be fabricated in single-package processing units, or even on a single semiconductor chip, in order to reduce the communication time between the processor and the memory device(s).

Applications for memory cells, wordlines and bitlines can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of etching a feature into a substrate, comprising:
    forming a plurality of hard mask layers over material of a substrate to be etched, one of the plurality being an innermost of the hard mask layers;
    forming a feature pattern in the plurality of hard mask layers;
    etching a feature only partially into the substrate material using the plurality of hard mask layers with the feature pattern therein as a mask, such partial etching forming a residue within the feature pattern laterally over sidewalls of the innermost hard mask layer;
    after the partial etching, etching at least one of the hard mask layers selectively relative to the substrate material and remaining of the hard mask layers, the etching of the at least one of the hard mask layers etching said residue from the substrate;
    after the etching of at least one of the hard mask layers, further etching the feature into the substrate material using a mask comprising the innermost hard mask layer; and
    after the further etching, removing the mask comprising the innermost hard mask layer from the substrate and incorporating at least a portion of the feature into an integrated circuit.

2. A method of etching a feature into a substrate, comprising:
    forming a plurality of hard mask layers over material of a substrate to be etched, one of the plurality being an innermost of the hard mask layers;
    forming a feature pattern in the plurality of hard mask layers;
    etching a feature only partially into the substrate material using the plurality of hard mask layers with the feature pattern therein as a mask;
    after the partial etching, etching at least one of the hard mask layers selectively relative to the substrate material and remaining of the hard mask layers;
    after the etching of at least one of the hard mask layers, further etching the feature into the substrate material using a mask comprising the innermost hard mask layer, the further etching forming a residue within the feature pattern laterally over sidewalls of the innermost hard mask layer, and further comprising etching said residue from the substrate subsequent to said further etching; and
    after the further etching, removing the mask comprising the innermost hard mask layer from the substrate and incorporating at least a portion of the feature into an integrated circuit.

3. The method of claim 2 wherein the removing of the mask comprising the innermost hard mask layer comprises etching which also etches away the residue.

4. A method of etching a feature into a substrate, comprising:
    forming a plurality of hard mask layers over material of a substrate to be etched, one of the plurality being an innermost of the hard mask layers;
    forming a feature pattern in the plurality of hard mask layers;
    etching a feature only partially into the substrate material using the plurality of hard mask layers with the feature pattern therein as a mask;
    after the partial etching, etching at least one of the hard mask layers selectively relative to the substrate material and remaining of the hard mask layers;
    after the etching of at least one of the hard mask layers, further etching the feature into the substrate material using a mask comprising the innermost hard mask layer, the further etching forming a residue laterally over sidewalls of the substrate material, and further comprising etching said residue from the substrate subsequent to said further etching; and
    after the further etching, removing the mask comprising the innermost hard mask layer from the substrate and incorporating at least a portion of the feature into an integrated circuit.

5. The method of claim 4 wherein the removing of the mask comprising the innermost hard mask layer comprises etching which also etches away the residue.

6. A method of etching a feature into a substrate, comprising:
    forming a plurality of hard mask layers over material of a substrate to be etched, one of the plurality being an innermost of the hard mask layers;
    forming a feature pattern in the plurality of hard mask layers;
    etching a feature only partially into the substrate material using the plurality of hard mask layers with the feature pattern therein as a mask;
    after the partial etching, etching at least one of the hard mask layers selectively relative to the substrate material and remaining of the hard mask layers;
    after the etching of at least one of the hard mask layers, further etching the feature into the substrate material using a mask comprising the innermost hard mask layer, the further etching forming a residue within the feature pattern that is received laterally over sidewalls of both of the innermost hard mask layer and the substrate material, and further comprising etching said residue from the substrate subsequent to said further etching; and after the further etching, removing the mask comprising the innermost hard mask layer from the substrate and incorporating at least a portion of the feature into an integrated circuit.

7. The method of claim 6 wherein the removing of the mask comprising the innermost hard mask layer comprises etching which also etches away the residue.

8. The method of claim 1 wherein the hard mask layers number at least three.

9. The method of claim 8 wherein the hard mask layers number at least four.

10. The method of claim 1 wherein the partial etching is from 30% to 80% of a sum of the depths of the partial etching and the further etching into the substrate material.

11. The method of claim 10 wherein the partial etching is from 40% to 60% of said sum.

12. The method of claim 1 wherein the feature within the substrate material after said further etching has an aspect ratio of at least 4.

13. The method of claim 1 wherein the feature pattern is formed in an outermost of the hard mask layers using an imaging layer.

14. A method of etching a feature into a substrate, comprising:
    forming sacrificial masking material over material of a substrate to be etched; the sacrificial masking material comprising a first masking layer received over the substrate material, a second masking layer received over the first masking layer, a third masking layer comprising amorphous carbon received over the second masking layer, and an imaging layer comprising an organic photoresist received over the third masking layer; the substrate material being selectively etchable relative to the first masking layer, the third masking layer being selectively etchable relative to the second masking layer, the second masking layer being selectively etchable relative to the first masking layer and to the third masking layer, the first masking layer being selectively etchable relative to the substrate material;
    forming a feature pattern in the imaging layer;
    patterning the third masking layer by etching the third masking layer to the second masking layer, and selectively relative to the second masking layer, using the feature pattern of the imaging layer, at least some of the imaging layer remaining when commencing said etching of the third masking layer, said etching of the third masking layer removing all remaining of imaging layer from the substrate;
    patterning the second masking layer by etching the second masking layer to the first masking layer, and selectively relative to the first masking layer, using the patterned third masking layer as a mask;
    patterning the first masking layer by etching the first masking layer to the substrate material using the patterned second masking layer as a mask;
    after patterning the first masking layer, etching a feature only partially into the substrate material using the first, second and third masking layers as a mask;
    after the partial etching, etching remaining of the third and second masking layers from the substrate and further etching the feature into the substrate material using the first masking layer as a mask; and
    after the further etching, removing all remaining of the first masking layer from the substrate and incorporating at least a portion of the feature into an integrated circuit.

15. A method of etching a feature into a substrate, comprising:
    forming a first amorphous carbon-comprising layer over material of a substrate to be etched;
    forming an amorphous silicon-comprising layer over the first amorphous carbon-comprising layer;
    forming a second amorphous carbon-comprising layer over the amorphous silicon-comprising layer;
    forming a feature pattern through the second amorphous carbon-comprising layer, the amorphous silicon-comprising layer and the first amorphous carbon-comprising layer to the substrate material;
    etching a feature only partially into the substrate material using the second amorphous carbon-comprising layer, the amorphous silicon-comprising layer and the first amorphous carbon-comprising layer with the feature pattern therein as a mask;
    after the partial etching, further etching the feature into the substrate material using at least the first amorphous carbon-comprising layer as a mask; and
    after the further etching, removing all remaining of the first amorphous carbon-comprising layer from the substrate and incorporating at least a portion of the feature into an integrated circuit.

16. The method of claim 15 wherein the partial etching forms a residue within the feature pattern over at least the first amorphous carbon-comprising layer, and further comprising etching said residue from the substrate prior to said further etching.

17. The method of claim 15 wherein the further etching forms a residue within the feature pattern over at least the first amorphous carbon-comprising layer, and further comprising etching said residue from the substrate subsequent to said further etching.

18. The method of claim 15 wherein the further etching forms a residue laterally over the substrate material, and further comprising etching said residue from the substrate subsequent to said further etching.

19. The method of claim 15 wherein the further etching forms a residue within the feature pattern over at least the first amorphous carbon-comprising layer and laterally over the substrate material, and further comprising etching said residue from the substrate subsequent to said further etching.

20. The method of claim 15 wherein forming the feature pattern comprises patterning an imaging layer received over the second amorphous carbon-comprising layer.

* * * * *